United States Patent
Tsorng et al.

(10) Patent No.: US 11,409,338 B2
(45) Date of Patent: Aug. 9, 2022

(54) CONFIGURABLE LOCK DEVICE FOR COMPUTER EXPANSION CARDS

(71) Applicant: Quanta Computer Inc., Taoyuan (TW)

(72) Inventors: Yaw-Tzorng Tsorng, Taoyuan (TW);
Chun Chang, Taoyuan (TW);
Cheng-Chieh Weng, Taoyuan (TW);
Ming-Lung Wang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 264 days.

(21) Appl. No.: 16/717,453

(22) Filed: Dec. 17, 2019

(65) Prior Publication Data

US 2021/0181812 A1 Jun. 17, 2021

(51) Int. Cl.
*G06F 1/18* (2006.01)
*H05K 7/14* (2006.01)
*H01R 12/70* (2011.01)
*H01R 12/72* (2011.01)

(52) U.S. Cl.
CPC .............. *G06F 1/185* (2013.01); *G06F 1/184* (2013.01); *G06F 1/186* (2013.01); *H01R 12/7005* (2013.01); *H05K 7/1405* (2013.01); *H01R 12/721* (2013.01)

(58) Field of Classification Search
CPC .......... G06F 1/185; G06F 1/186; G06F 1/184; H01R 12/721; H01R 12/7005; H01R 12/7029; H01R 12/73; H05K 7/1405; H05K 7/1404
See application file for complete search history.

(56) References Cited

U.S. PATENT DOCUMENTS

| | | | |
|---|---|---|---|
| 5,726,865 A * | 3/1998 | Webb | H05K 7/1405 361/801 |
| 10,691,183 B2 * | 6/2020 | Fernandes | G06F 1/185 |
| 2009/0111296 A1 * | 4/2009 | Zhu | H01R 12/7005 439/78 |

* cited by examiner

*Primary Examiner* — James Wu
(74) *Attorney, Agent, or Firm* — Nixon Peabody LLP

(57) ABSTRACT

A configurable lock device is disclosed. The configurable lock device includes a first latch base, which includes at least two receiving spaces. The two receiving spaces are configured to receive a latch device to secure a computer expansion card. The configurable lock device also includes a connecting element separating the at least two receiving spaces.

8 Claims, 7 Drawing Sheets

CONFIGURABLE LOCK DEVICE FOR COMPUTER EXPANSION CARDS

TECHNICAL FIELD

The present disclosure relates generally to a configurable lock device for computer expansion cards. More particularly, aspects of this disclosure relate to configurable lock device for securing varying size expansion cards within an electronic device.

BACKGROUND

Computer systems, such as desktop computers, laptop computers, work stations, and servers, are well known. These computer systems typically include a system board or motherboard secured within a chassis. Other components, such as a hard disk drive, floppy disk drive, CD ROM drive, one or more cooling fans, and a power supply, are also mounted within the chassis. A computer system may also include one or more built-in peripheral devices, including a keyboard, mouse, video display, and both serial and parallel ports.

A typical motherboard includes a large printed circuit board having a number of components mounted thereon, including a processor coupled to a host or local bus, a chip set, system memory (e.g., SDRAM) coupled to a memory bus, and a Peripheral Component Interconnect (PCI) bus. The chip set bridges the PCI bus with the local bus, and also bridges the PCI bus to each of an Industry Standard Architecture (ISA) bus and a Small Computer System Interface (SCSI) bus, if present. The chip set may also provide a system memory controller and bridge the memory bus to the local bus (as well as to the PCI bus). In addition, a motherboard typically includes input/output (I/O) connectors, floppy disk and hard disk drive connections, as well as circuitry for controlling any built-in peripheral devices—e.g., hard disk drives, floppy disk drives, and CD ROM drives, as noted above.

Generally, one or more card connectors (also referred to as card slots or card sockets) are located on a motherboard; each card connector for receiving a peripheral card. A peripheral card (also referred to as an expansion card, expansion board, or daughterboard) is added to a computer system to enhance that system's capabilities. For example, a peripheral card may provide a network interface, enhanced audio capability, or enhanced graphics. A peripheral card, as well as the card connector into which it is inserted for coupling to the motherboard, is typically PCI compatible or ISA compatible, such that the peripheral card (and connector) can be coupled to the PCI bus or ISA bus, respectively.

SUMMARY

A configurable lock device is disclosed. The configurable lock device includes a first latch base, which includes receiving spaces. The receiving spaces are configured to receive a latch device to secure a computer expansion card. The configurable lock device also includes a connecting element separating the receiving spaces.

In some implementations, the first latch base further includes an aperture configured to receive a securing element to attach the configurable lock device to a printed circuit board (PCB). In some implementations, the latch device includes a protruding element extending therefrom. Each of the two receiving spaces includes an aperture configured to receive the protruding element of the latch device. The configurable lock device can also include a second latch base. The second latch base also includes receiving spaces configured to receive a latch device to secure a computer expansion card. The second latch base can also include a connecting element separating the receiving spaces. The configurable lock device can also include a connector element configured to link the connecting element of the first latch base and the connecting element of the second latch base.

The connector element includes a proximal end and an opposing distal end separated by a connector body. The proximal end and the distal end both include a notch element configured to be received within the connecting element of each of the first latch base and the connecting element of the second latch base. The second latch base can also include an aperture configured to receive a second securing element to attach the second latch base to a printed circuit board (PCB). The second latch device includes a protruding element extending therefrom. Each receiving of the receiving spaces includes an aperture configured to receive the protruding element of the latch device.

A printed circuit board is also provided. The printed circuit board includes a computer expansion card and a configurable lock device. The configurable lock device includes a first latch base and at least two receiving spaces. Each of the receiving spaces is configured to receive a latch device to secure a computer expansion card. The computer expansion card can include an M.2 Expansion card. The receiving spaces are oriented to account for multiple length M.2 Expansion cards. The configurable lock device also includes a connecting element separating the receiving spaces. The first latch base can also include an aperture configured to receive a securing element to attach the first latch base to the PCB.

In some implementations, the latch device includes a protruding element extending therefrom. The receiving spaces includes an aperture configured to receive the protruding element of the latch device. The configurable lock device can also include a second latch base. The second latch base also includes receiving spaces configured to receive a second latch device to secure a computer expansion card. The second latch base can also include a connecting element separating the receiving spaces. The configurable lock device can also include a connector element configured to link the connecting element of the first latch base and the connecting element of the second latch base.

The connector element includes a proximal end and an opposing distal end separated by a connector body. The proximal end and the distal end both include a notch element configured to be received within the connecting element of each of the first latch base and the connecting element of the second latch base. The second latch base can also include an aperture configured to receive a securing element to attach the configurable lock device to a printed circuit board (PCB). The second latch device includes a protruding element extending therefrom. Each receiving space includes an aperture configured to receive the protruding element of the latch device.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of example embodiments together with reference to the accompanying drawings, in which.

Figure 1:
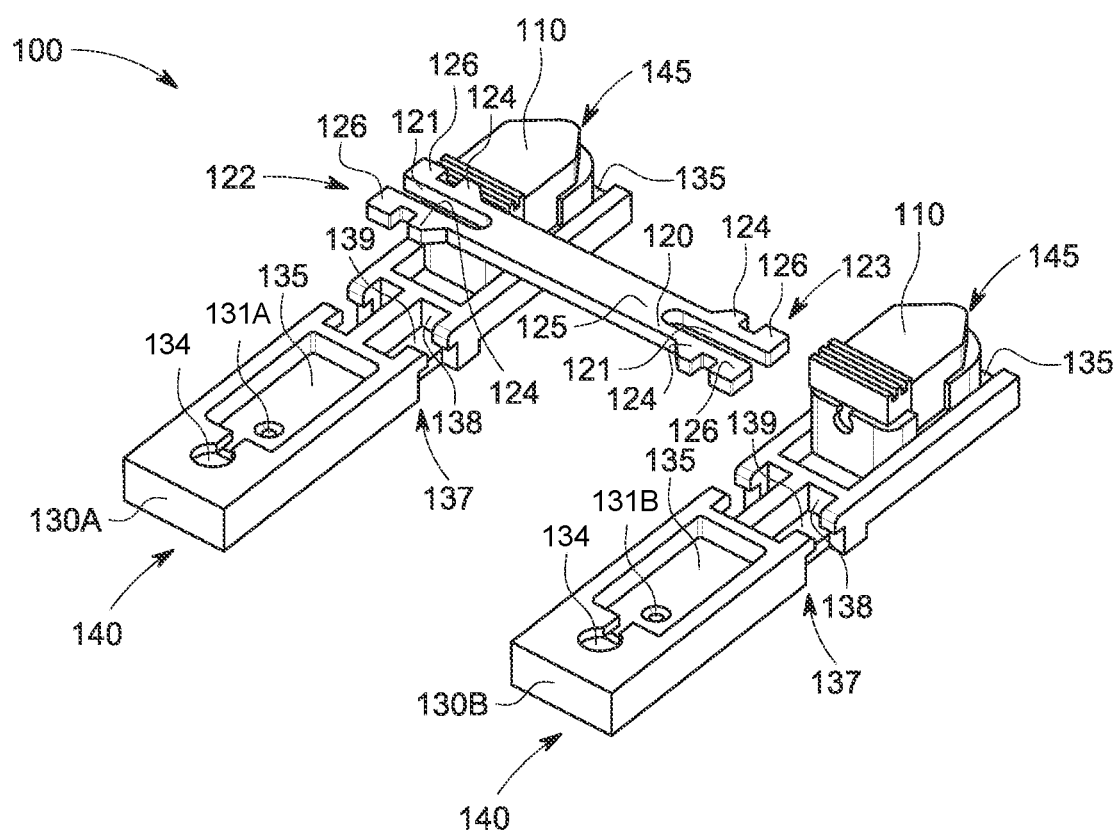
FIG. 1 is an axonometric view of an example configurable lock device, in accordance with an embodiment of the disclosure.

The present disclosure is susceptible to various modifications and alternative forms, and some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION OF THE ILLUSTRATED EMBODIMENTS

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at, near, or nearly at," or "within 3-5% of," or "within acceptable manufacturing tolerances," or any logical combination thereof, for example.

As disclosed in further detail herein, a configurable lock device can include at least one latch base for receiving a latch device in a plurality of locations (e.g., two or more locations). Each of the plurality of locations can be located at different points along a length of the latch base. The latch device can include a latching portion for securing a card or other module. The latching portion can be designed to engage a distal end of a card while the proximal end of the card is operably coupled to a socket or other receptacle of a circuit board (e.g., motherboard). In some cases, the card can be an M.2 card.

The plurality of locations of the latch base can permit a single latch device to be installed at multiple locations along the length of the latch base. Thus, use of a single configurable lock device on a circuit board can nevertheless permit cards of various sizes to be installed on the circuit board by simply installing the latch device into the appropriate location on the latch base. For example, a latch base may have a first location associated with a 80 mm card and a second location associated with a 110 mm card. Thus, if a 80 mm card is desired to be used, the latch device can be installed in the latch base at the first location. However, if a 110 mm card is desired to be used, the latch device can be installed in the latch base at the second location. In some cases, the latch base can have two or more locations associated with any combination of the following lengths including 16 mm, 26 mm, 30 mm, 38 mm, 42 mm, 60 mm, 80 mm, and 110 mm. In some cases, other lengths can be used.

In some cases, the configurable lock device can be used with a single latch base or multiple latch bases. In some cases, the use of multiple latch bases can permit side-by-side installation of cards in a system. When multiple latch bases are used, a connector body can be installed between the latch bases to increase stability of the latch bases. In some cases, the use of a connector body can permit the latch bases to be installed into the circuit board using fewer connection points (e.g., using fewer through holes in the circuit board) due to the increased stability of being joined to one another. In some cases, a configurable lock device can include a first latch base attached to a circuit board at a first point; a second latch device attached to the circuit board at a second point; and a connector body coupling the first latch base to the second latch base. In such a configurable lock device, the first and second latch bases can be thereby attached to the circuit board only at the first and second points, without requiring additional points of attachment.

For illustrative purposes, the figures of this disclosure present a configurable lock device having first and second latch bases. However, in some cases, a configurable lock device can include only a first latch base and not a second latch base.

These illustrative examples are given to introduce the reader to the general subject matter discussed here and are not intended to limit the scope of the disclosed concepts. The following sections describe various additional features and examples with reference to the drawings in which like numerals indicate like elements. Directional descriptions are used to describe the illustrative embodiments but, like the illustrative embodiments, should not be used to limit the present disclosure. The elements included in the illustrations herein may not be drawn to scale.

FIG. 1 is an axonometric view of an example configurable lock device 100, in accordance with an embodiment of the disclosure. The configurable lock device 100 can include a first latch base 130A and a second latch base 130B. The first latch base 130A can be connected or attached to the second latch base 130B by connector element 120. The first latch base 130A includes receiving spaces 135. As illustrated herein, a latch device 110 can be fixed within one of the receiving spaces 135. The receiving space 135 includes an aperture 134 configured to receive the latch device 110. For example, the latch device 110 can include a protruding element extending therefrom (not shown). The aperture 134 of the receiving space 135 is configured to receive the protruding element of the latch device 110. In alternative embodiments, the latch device 110 can include an aperture (not shown). A securing element, such as, for example, a threaded bolt or screw can be inserted through the aperture 134 of the receiving space 135 and the aperture (not shown) of the latch device 110 to secure the latch device 110.

The two receiving spaces 135 can be separated by a connecting element 137. The connecting element 137 includes a mating element 138 and a tab 139. The connector element 120 includes a distal end 123 and a proximal end 122, both separated by a connector body 125. Each end of the connector element 120 includes first notch elements 124, second notch elements 126, and a separating element 121 therebetween the first notch elements 124 and the second notch elements 126. The separating element 121 enables flexibility at the proximal end 122 and the distal end 123 of the connector element 120, for attaching the connector element 120 to the first and second latch bases. For example, the second notch elements 126 of the proximal end 122 are configured to be received within the mating element 138 of the first latch base 130A.

Likewise, the second notch elements 126 of the distal end 123 is configured to be received within the mating element 138 of the second latch base 130B. The separating element 121 provides flexibility at the proximal end 122 and the distal end 123 to attach the described components. The first latch base 130A and the second latch base 130B both include a proximal end 145 and a distal end 140. Both latch bases can include a receiving space 135 at the proximal end 145 and a receiving space 135 at the distal end 140. While two receiving spaces 135 are illustrated with respect to both latch bases, the present disclosure is not limited to two receiving spaces 135. Embodiments of the present disclosure can include three, four, or an infinite number of receiving spaces 135; each configured to receive a latch device 110. In some embodiments, each receiving space 135 can be separated by a connecting element 137. In alternative embodiments, the receiving spaces 135 are not separated by a connecting element 137. Rather, each latch base can include a single connecting element 137 in the center of the latch base, and multiple receiving spaces 135 on both sides of the connecting element 137.

For the purposes of this illustration, the first latch base 130A can be located at the proximal end 122 of the connector element 120, while the second latch base 130B is located at the distal end 123 of the connector element 120. The present embodiment is not intended to be limited by the illustrated orientation, as the first latch base 130A, the second latch base 130B, and the connector element 120 can be arranged in various arrangements.

Figure 2:
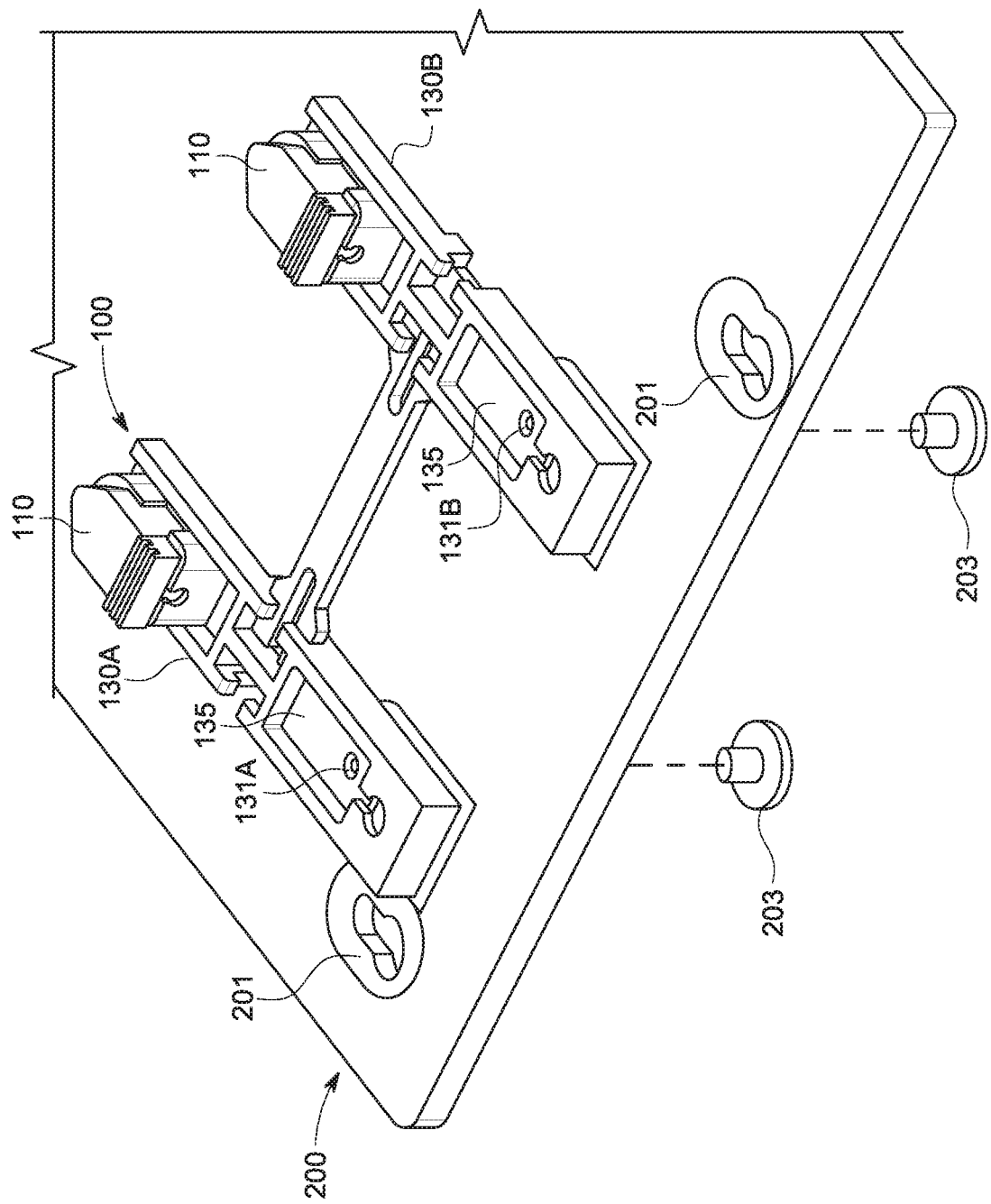
FIG. 2 is an axonometric view of a printed circuit board assembly (PCBA) incorporating the configurable lock device of FIG. 1, in accordance with an embodiment of the disclosure.

FIG. 2 is an axonometric view of a printed circuit board assembly (PCBA) 200 incorporating the configurable lock device 100 of FIG. 1. The PCBA 200 is configured to receive various components like resistors, ICs (Integrated Circuits), capacitors, transformers, and any other components depending on the application and desired characteristics of the PCBA. The PCBA 200 includes apertures 201 for securing the PCBA to a chassis. The PCBA 200 can include additional apertures for securing one or more latch bases, such as first latch base 130A and second latch base 130B. In some cases, a securing element 203 can be used to secure the latch bases to the PCBA 200. The first latch base 130A can include a mounting aperture 131A. Similarly, the second latch base 130B can include a mounting aperture 131B. The respective mounting apertures 131A, 131B can be threaded, such as to be configured to receive a securing element 203 therethrough. The securing element 230 can include a bolt, a screw, or any known types of fasteners. In some cases, other techniques for securing a latch base to a PCBA 200 can be used. Once secured to the PCBA 200, the latch bases are configured to secure an expansion card. This is discussed in greater detail below.

Figure 3:
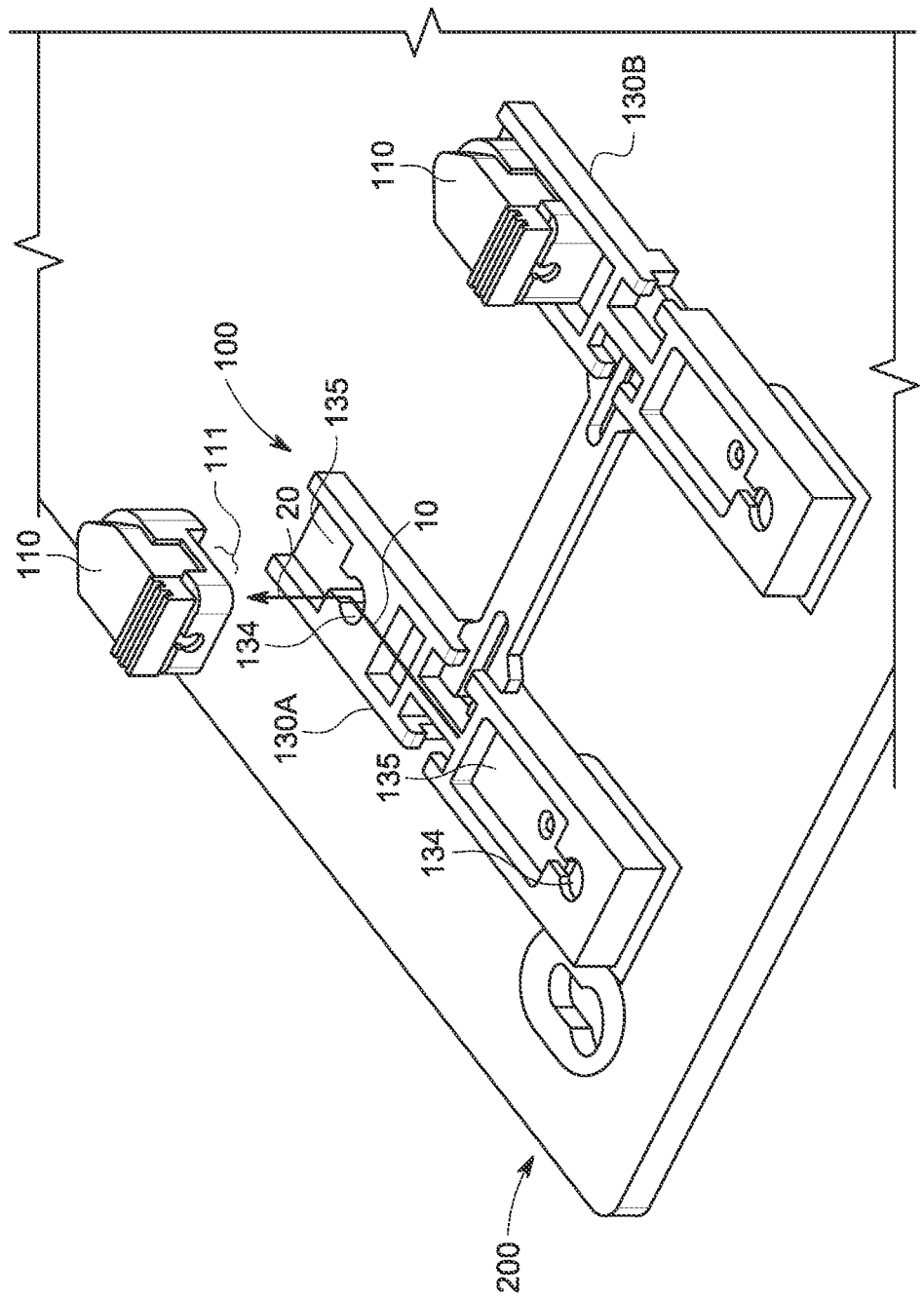
FIG. 3 is an axonometric view of an example latch device being removed from the configurable lock device mounted within the PCBA of FIG. 2, in accordance with an embodiment of the disclosure.

FIG. 3 is an axonometric view of an example latch device 110 being removed from the first latch base 130A mounted within the PCBA 200 of FIG. 2. In some embodiments, the aperture 134 of the receiving space 135 can be configured as bell-shaped punch holes, with a larger radius and adjacent-smaller radius (not shown). As such, the latch device 110 can be removed from the first latch base 130A in two motions. First, the latch device 110 is positioned in direction 10 to release the latch device 110 from the first latch base 130A. Specifically, a protruding element 111 extending from the base of the latch device 110 is positioned from the adjacent-smaller radius to the larger radius of the aperture 134. Second, the latch device 110 is positioned in direction 20 to dismount the latch device 110 from the receiving space 135 of the first latch base 130A.

Figure 4:
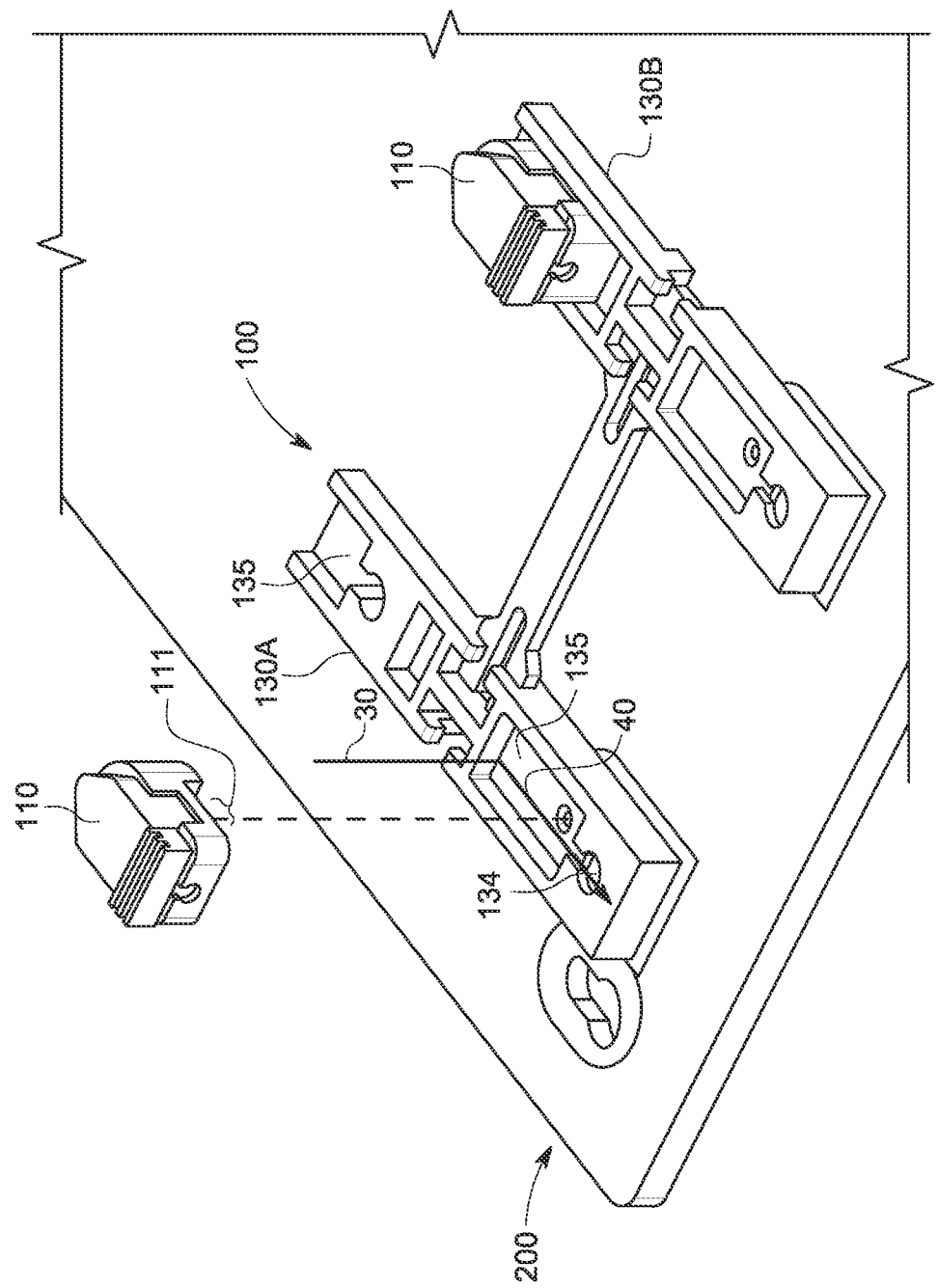
FIG. 4 is an axonometric view of an example latch device being mounted within the configurable lock device mounted within the PCBA of FIG. 2, in accordance with an embodiment of the disclosure.

FIG. 4 is an axonometric view of an example latch device 110 being mounted within the receiving space 135 of the first latch base 130A, mounted within the PCBA 200 of FIG. 2. In some embodiments, the aperture 134 of the receiving space 135 can be configured as bell-shaped punch holes, with a larger radius and adjacent-smaller radius (not shown). As such, the latch device 110 can be mounted to the first latch base 130A in two motions. First, the latch device 110 is positioned in direction 30 to lower the latch device 110 into the first latch base 130A. Specifically, a protruding element 111 extending from the base of the latch device 110 is positioned into the larger radius of the aperture 134. Second, the latch device 110 is positioned in direction 40 to mount the latch device 110 into the receiving space 135 of the first latch base 130A. Specifically, the protruding element extending from the base of the latch device 110 is positioned into the adjacent-smaller radius of the aperture 134. The latch device 110 can be mounted into either receiving space of the first latch base 130A, and the second latch base 130B.

Figure 5:
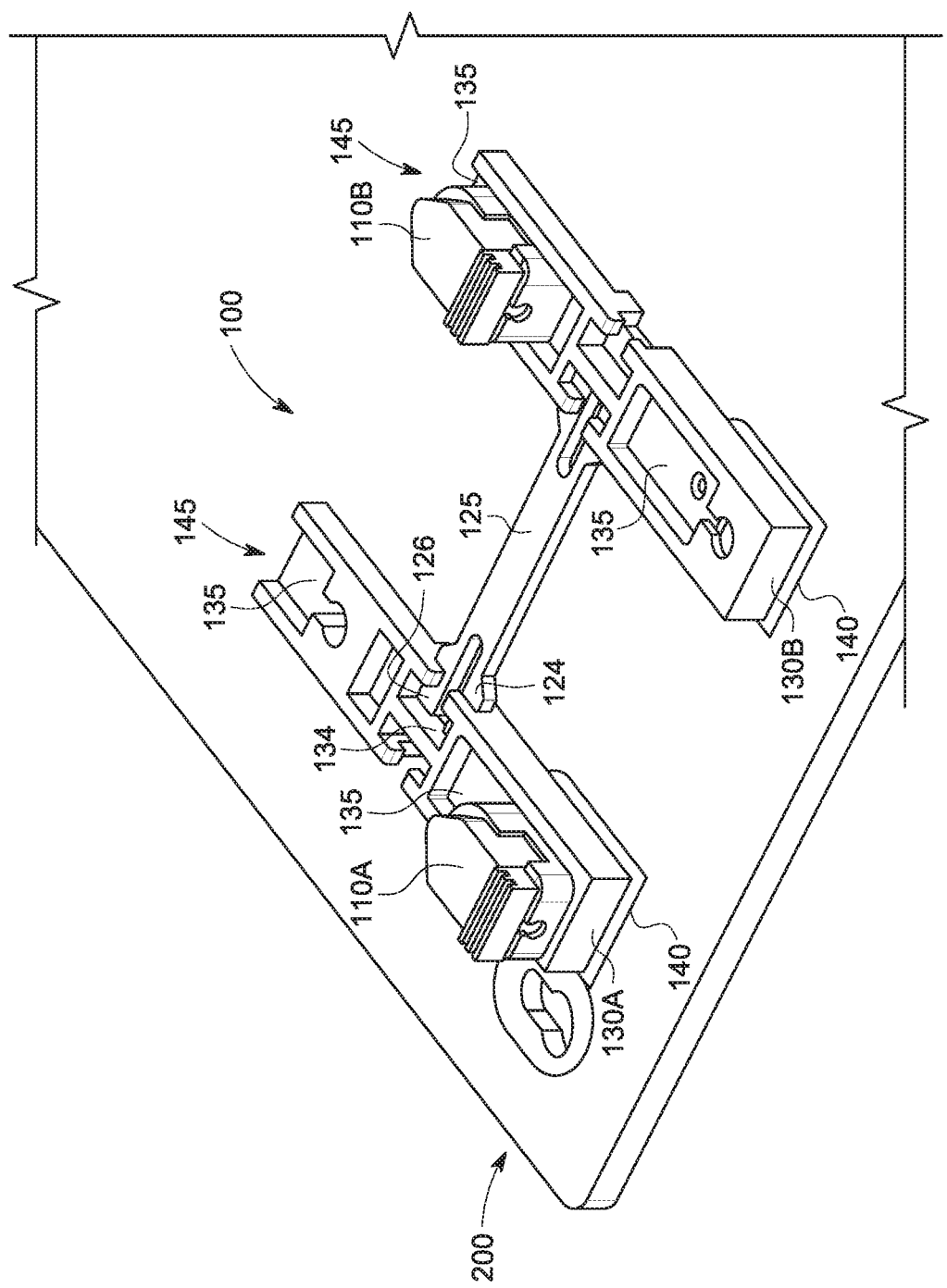
FIG. 5 is an axonometric view of a first example configuration of the configurable lock device, in accordance with an embodiment of the disclosure.

FIG. 5 is an axonometric view of a first example configuration of the configurable lock device 100, in accordance with an embodiment of the disclosure. As illustrated herein, the first latch base 130A includes a latch device 110A at the receiving space 135 at the distal end 140.

Figure 6:
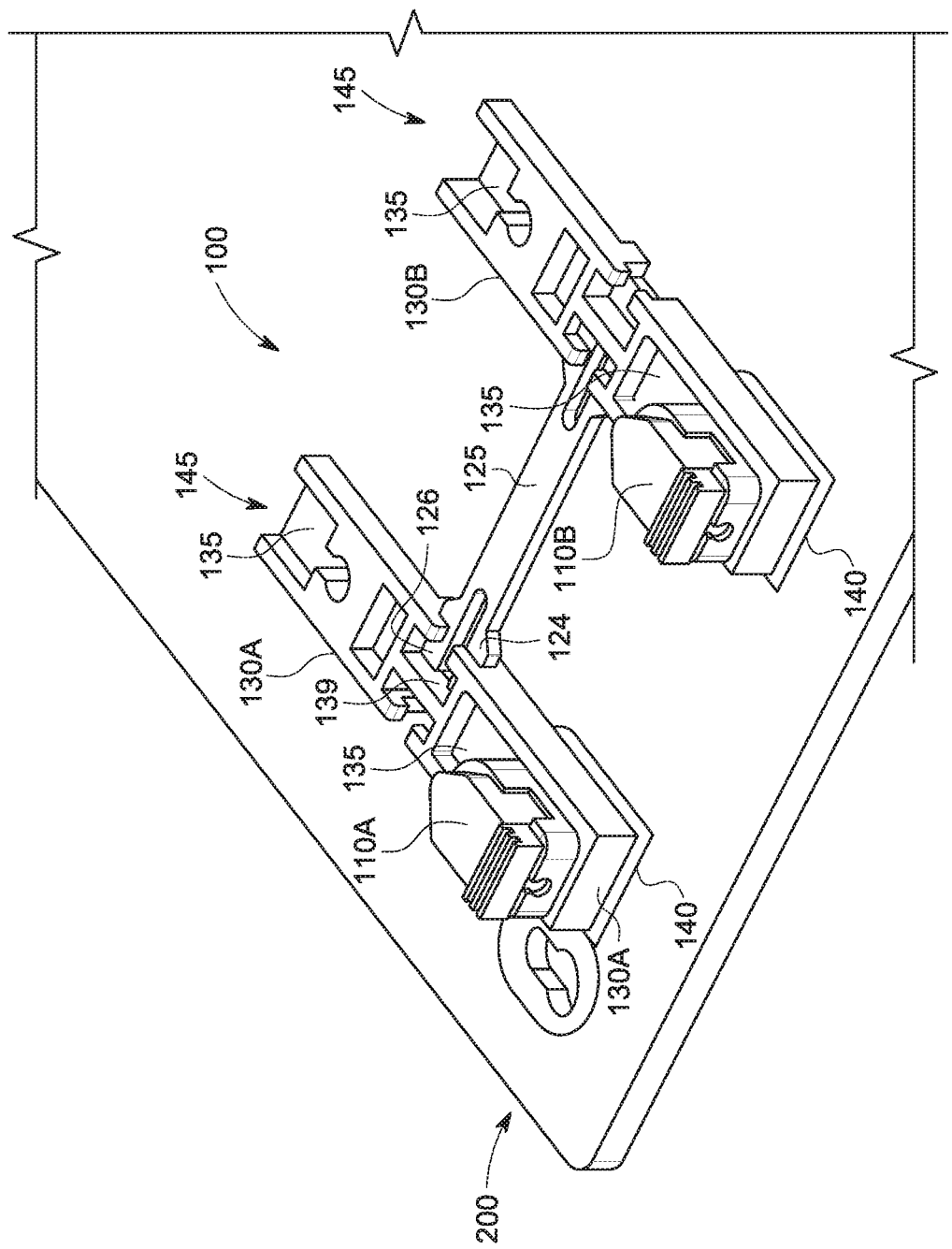
FIG. 6 is an axonometric view of a second example configuration of the configurable lock device, in accordance with an embodiment of the disclosure.

FIG. 6 is an axonometric view of a second example configuration of the configurable lock device 100, in accordance with an embodiment of the disclosure. As illustrated herein, the second latch base 130B includes a latch device 110B at the receiving space 135 at the proximal end 140.

Figure 7:
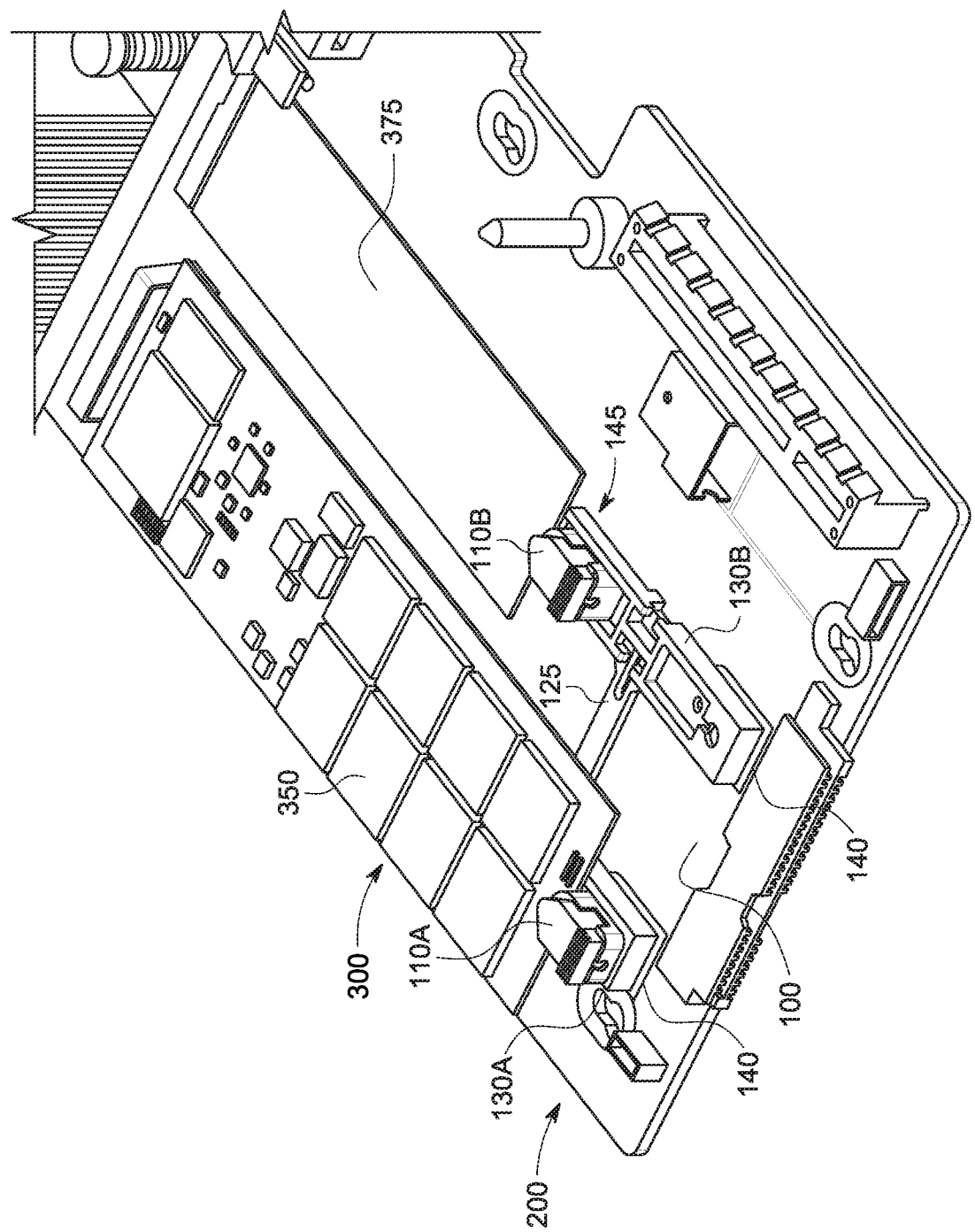
FIG. 7 is an axonometric view of an example top electronic device incorporating the printed circuit board assembly (PCBA) incorporating the configurable lock device, in accordance with an embodiment of the disclosure.

FIG. 7 is an axonometric view of an example of an electronic device 300 incorporating the PCBA 200 and the configurable lock device 100, in accordance with an embodiment of the disclosure. The electronic device can include a chassis, a rack, or a server device. The first latch base 130A includes a first latch device 110A positioned at the distal end 140. The position of the first latch device 110A within the first latch base 130A enables the first latch device 110A to secure a first expansion card 350. The second latch base 130B includes a second latch device 110B positioned at the proximal end 145. The position of the second latch device 110B within the second latch base 130B enables the second latch device 110B to secure a second expansion card 375. As illustrated herein, the first expansion card 350 is larger than the second expansion card 375. In some embodiments, the first expansion card 350 and the second expansion cards 375 are M.2 expansion cards.

As used in this application, the terms "component," "module," "system," or the like, generally refer to a computer-related entity, either hardware (e.g., a circuit), a combination of hardware and software, software, or an entity related to an operational machine with one or more specific functionalities. For example, a component may be, but is not limited to being a process running on a processor (e.g., digital signal processor), a processor, an object, an executable, a thread of execution, a program, and/or a computer. By way of illustration, both an application running on a controller, as well as the controller, can be a component. One or more components may reside within a process and/or thread of execution and a component may be localized on one computer and/or distributed between two or more computers. Further, a "device" can come in the form of specially designed hardware; generalized hardware made specialized by the execution of software thereon that enables the hardware to perform specific function; software stored on a computer-readable medium; or a combination thereof.

Computing devices typically include a variety of media, which can include computer-readable storage media and/or communications media, in which these two terms are used herein differently from one another as follows. Computer-readable storage media can be any available storage media that can be accessed by the computer; is typically of a non-transitory nature; and can include both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can include, but are not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or other tangible and/or non-transitory media that can be used to store desired information. Computer-readable storage media can be accessed by one or more local or remote computing devices, e.g., via access requests, queries or other data retrieval protocols, for a variety of operations with respect to the information stored by the medium.

The terminology used herein is for the purpose of describing particular embodiments only, and is not intended to be limiting of the invention. As used herein, the singular forms "a," "an" and "the" are intended to include the plural forms as well, unless the context clearly indicates otherwise. Furthermore, to the extent that the terms "including", "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A configurable lock device comprising:
    a latch base comprising:
        a latch device configured to secure a first computer expansion card or a second computer expansion card;
        a proximal receiving space for removably receiving the latch device;
        a distal receiving space for removably receiving the latch device;
        a connecting element separating the proximal receiving space and the distal receiving space such that the latch device is usable to secure the first computer expansion card when the latch device is received by the proximal receiving space and the latch device is usable to secure the second computer expansion card when the latch device is received by the distal receiving space, and wherein the second computer expansion card is longer than the first computer expansion card; and
        an aperture configured to receive a securing element to attach the latch base to a printed circuit board (PCB).

2. The configurable lock device of claim 1,
    wherein the latch device comprises a protruding element extending therefrom,
    wherein each of the proximal receiving space and the distal receiving space comprises a respective aperture configured to receive the protruding element of the latch device.

3. The configurable lock device of claim 1, further comprising an additional latch base comprising:
    an additional latch device configured to secure a third computer expansion card or a fourth computer expansion card;
    an additional proximal receiving space for removably receiving the additional latch device;
    an additional distal receiving space for removably receiving the additional latch device; and
    an additional connecting element separating the additional proximal receiving space and the additional distal receiving space such that the additional latch device is usable to secure the third computer expansion card when the additional latch device is received by the additional proximal receiving space and the additional latch device is usable to secure the fourth computer expansion card when the additional latch device is received by the additional distal receiving space, and wherein the fourth computer expansion card is longer than the third computer expansion card.

4. The configurable lock device of claim 3, further comprising a connector element configured to link the connecting element of the latch base and the additional connecting element of the additional latch base.

5. The configurable lock device of claim 4, wherein the connector element comprises a proximal end and an opposing distal end separated by a connector body.

6. The configurable lock device of claim 3, wherein the additional latch base further comprises an additional aperture configured to receive an additional securing element to attach the additional latch base to the PCB.

7. The configurable lock device of claim 6, wherein when the configurable lock device is coupled to the PCB, the latch base is directly attached to the PCB at only a first PCB aperture using the securing element and the additional latch base is directly attached to the PCB at only a second PCB aperture using the additional securing element.

8. The configurable lock device of claim 3,
wherein the additional latch device comprises an additional protruding element extending therefrom,
wherein each of the additional proximal receiving space and the additional distal receiving space of the additional latch base comprises a respective aperture configured to receive the additional protruding element of the additional latch device.

\* \* \* \* \*